United States Patent
Wang et al.

(10) Patent No.: US 6,841,470 B2
(45) Date of Patent: *Jan. 11, 2005

(54) REMOVAL OF RESIDUE FROM A SUBSTRATE

(75) Inventors: Li-Shun Wang, Santa Clara, CA (US); John Chu, Fremont, CA (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/476,633

(22) Filed: Dec. 31, 1999

(65) Prior Publication Data

US 2002/0001955 A1 Jan. 3, 2002

(51) Int. Cl.[7] ............................................. H01L 21/302
(52) U.S. Cl. ...................... 438/633; 438/637; 438/672; 438/693; 438/906
(58) Field of Search ................................ 438/633, 637, 438/672, 692, 693, 906, FOR 111, FOR 347

(56) References Cited

U.S. PATENT DOCUMENTS

| | | | | |
|---|---|---|---|---|
| 4,992,135 A | * | 2/1991 | Doan | 438/692 |
| 5,352,277 A | * | 10/1994 | Sasaki | 106/6 |
| 5,389,194 A | * | 2/1995 | Rostoker et al. | 134/1.3 |
| 5,478,436 A | * | 12/1995 | Winebarger et al. | 438/693 |
| 5,607,718 A | * | 3/1997 | Sasaki et al. | |
| 5,709,755 A | * | 1/1998 | Kuo et al. | |
| 5,855,792 A | * | 1/1999 | Adams et al. | 210/696 |
| 5,876,271 A | * | 3/1999 | Oliver | 451/60 |
| 5,911,836 A | * | 6/1999 | Hada et al. | 134/2 |
| 5,990,012 A | * | 11/1999 | Robinson et al. | |
| 6,022,400 A | * | 2/2000 | Izumi et al. | |
| 6,043,155 A | * | 3/2000 | Homma et al. | |
| 6,068,787 A | * | 5/2000 | Grumbine et al. | |
| 6,068,879 A | * | 5/2000 | Pasch | |
| 6,071,809 A | * | 6/2000 | Zhao | |
| 6,099,662 A | * | 8/2000 | Wang et al. | |
| 6,132,289 A | * | 10/2000 | Labunsky et al. | 451/6 |
| 6,149,696 A | * | 11/2000 | Jia | 51/308 |
| 6,159,858 A | * | 12/2000 | Kishii et al. | |
| 6,218,306 B1 | * | 4/2001 | Fishkin et al. | 438/692 |
| 6,368,955 B1 | * | 4/2002 | Easter et al. | 438/633 |
| 6,423,148 B1 | * | 7/2002 | Aoki | 134/3 |
| 6,448,182 B1 | * | 9/2002 | Hall et al. | 438/692 |

\* cited by examiner

*Primary Examiner*—George Fourson
*Assistant Examiner*—Joannie Adelle Garcia
(74) *Attorney, Agent, or Firm*—Blakely, Sokoloff, Taylor & Zafman LLP

(57) ABSTRACT

A method and an apparatus of removing a particle from a metal plug on a substrate is disclosed. The method comprises introducing a slurry onto the metal layer and polishing the metal layer. A solution comprising hydrogen peroxide is introduced onto the metal plug and at least one particle is removed from the metal plug.

25 Claims, 12 Drawing Sheets

REMOVAL OF RESIDUE FROM A SUBSTRATE

BACKGROUND OF THE INVENTION

1. Field of the Invention

The invention relates generally to integrated circuits and more specifically to a method and an apparatus for removing a particle from a portion of a metal plug on a substrate.

2. Description of Related Art

Integrated circuits are made up of literally millions of active devices formed in or on a silicon substrate or well. The active devices that are initially isolated from one another are later connected together to form functional circuits and components. The devices are interconnected together through the use of well known multilevel interconnections. A cross-sectional illustration of a typical multilevel interconnection structure 10 is shown in FIG. 1. Interconnection structures normally have a first layer of metallization, an interconnection layer 12 (typically aluminum alloys with up to 3% copper), a second level of metallization 14, and sometimes a third or even fourth level of metallization. Interlevel dielectrics 16 (ILDs), such as doped and undoped silicon dioxide ($SiO_2$), are used to electrically isolate the different levels of metallization in silicon substrate or well 18. The electrical connections between different interconnection levels are made through the use of metallized vias 11 formed in ILD 16. In a similar manner, metal contacts 22 are used to form electrical connections between interconnection levels and devices formed in well 18. The metal vias 11 and contacts 22, hereinafter being collectively referred to as "vias" or "plugs", are generally filled with tungsten 13 and generally employ an adhesion layer 15 such as TiN. Adhesion layer 15 acts as an adhesion layer for the tungsten metal layer 13 which is known to adhere poorly to $SiO_2$. At the contact level, the adhesion layer acts as a diffusion barrier to prevent W and Si from reacting.

In one process, metallized vias or contacts are formed by a blanket tungsten deposition and a chemical mechanical polish (CMP) process. In a typical process, via holes 23 are etched through an ILD 24 to interconnection lines or a semiconductor substrate 26 formed below as shown in FIG. 2a. Next, a thin adhesion layer 28, such as TiN, is generally formed over ILD 24 and into via hole 23, as shown in FIG. 2b. Next, a conformal tungsten film 29 is blanket deposited over the adhesion layer and into the via hole 23. The deposition is continued until the via hole 23 is completely filled with tungsten. Next, the metal films formed on the top surface of ILD 24 are removed by CMP, thereby forming metal vias or plugs 28.

In a typical CMP process as shown in FIG. 2c, the substrate or wafer 30 is placed face-down on a polishing pad 32 which is fixedly attached to a rotatable platen 34. In this way, the thin film of a metal layer to be polished (i. e., tungsten film 29) is placed in direct contact with pad 32. A carrier 36 is used to apply a downward pressure $F_1$ against the backside of substrate 30. During the polishing process, pad 32 and platen 34 are rotated while a downward force is placed on substrate 30 by carrier 36. An abrasive and chemically reactive solution, commonly referred to as "slurry" 35 is introduced onto pad 32 during polishing. Slurries generally include an abrasive material such as alumina or silica. The slurry initiates the polishing process by chemically reacting with the film being polished. The polishing process is facilitated by the rotational movement of pad 32 relative to wafer 30 as slurry is provided to the wafer/pad interface. Polishing is continued in this manner until all of the film on the insulator is removed.

After polishing, the substrate is generally rinsed with a solution such as deionized water in order to remove particles that remain on the substrate after the CMP operation. Conventional rinsing methods include using a scrubber with deionized water. However, high-speed spin rinse generally does not remove all of the particles. Another conventional method is a "magasonic" bath that involves high frequency vibration in which particles are shaken off the substrate. This method also leaves particles on the metal layer.

To properly form multiple layers of interconnect and to increase die yield, it is necessary to reduce particles that may block electrical conduction from one metal layer to another metal layer. If a particle is on a via, there is no electrical connection between the area where the particle is located and the metal layer. Accordingly, removing as many particles from a metal layer reduces the failures that may occur in an integrated circuit.

Another way in which the integrity of the metal layer may be affected relates to the removal of the metal layer during the polishing process. In removing particles, it must be ensured that a metal layer is not removed to a level such that a gap exists between a metal layer subsequently deposited onto the via or contact which may affect electrical conduction between the metal layer and the via.

Despite advances that have been made in removing particles from metallized plugs in contacts and vias, there are still failures that occur in integrated circuits due to inadequate removal of particles from a metal layer. It is therefore desirable to have a method that efficiently removes particles from a metal layer and simplifies the conventional processes used.

SUMMARY OF THE INVENTION

A method and an apparatus for polishing a metal layer on a substrate is disclosed. A rinsing solution comprising hydrogen peroxide is introduced onto a metal plug.

BRIEF DESCRIPTION OF THE DRAWINGS

The features, aspects, and advantages of the invention will become more thoroughly apparent from the following detailed description, appended claims, and accompanying drawings.

FIG. 2b is a cross-sectional illustration showing the formation of an adhesion layer and a tungsten layer on the substrate of FIG. 2a.

DETAILED DESCRIPTION OF THE INVENTION

The following detailed description and the accompanying drawings are provided for the purpose of describing and illustrating presently preferred embodiments of the invention only, and are not intended to limit the scope of the invention.

One embodiment of the invention relates to a method and an apparatus for removing a particle from a metal layer. A slurry is introduced over the metal layer and the metal layer is polished. The metal layer is then rinsed with a solution that comprises hydrogen peroxide.

Figure 1:
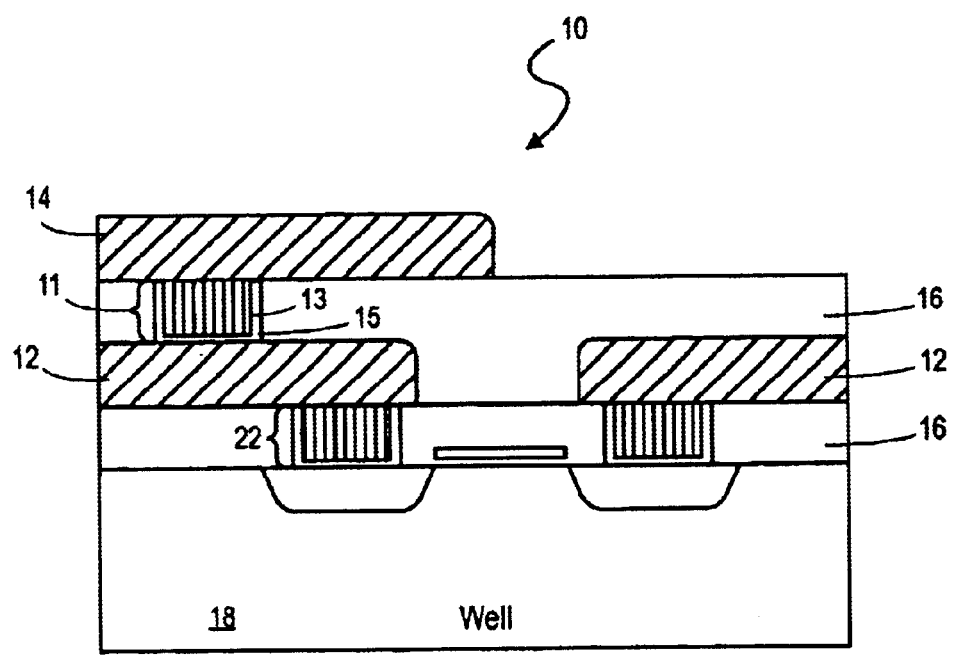
FIG. 1 is a cross-sectional illustration showing a portion of a standard multilevel integrated circuit.
Figure 2A:
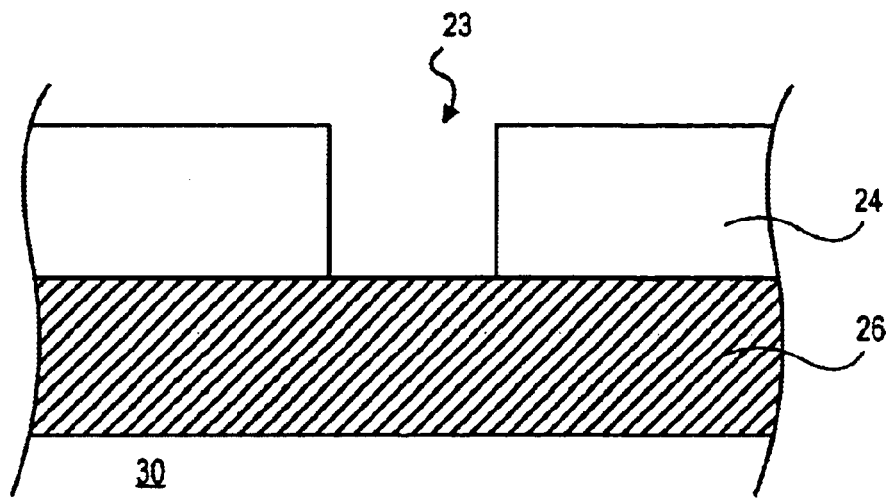
FIG. 2a is a cross-sectional illustration showing the formation of a via hole through an insulating layer formed on a conductive layer of a semiconductor substrate.
Figure 2B:
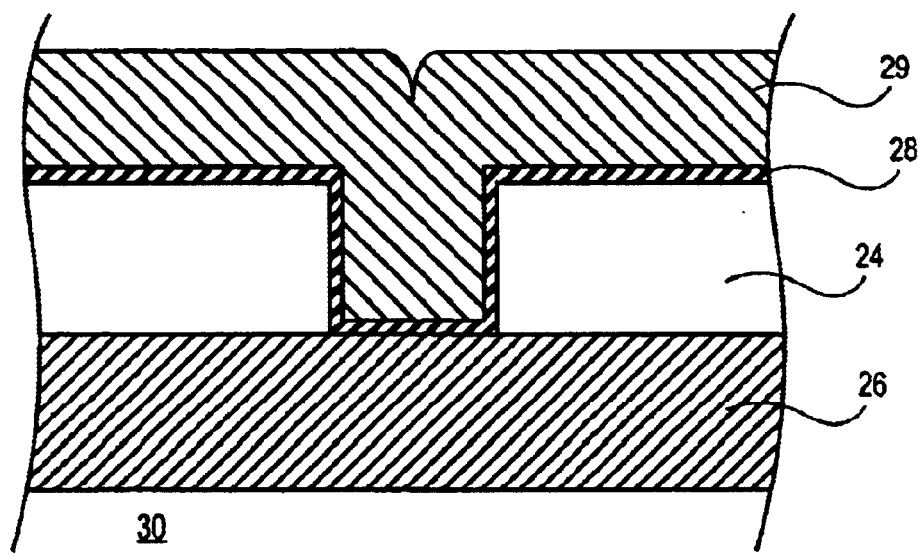
Figure 2C:
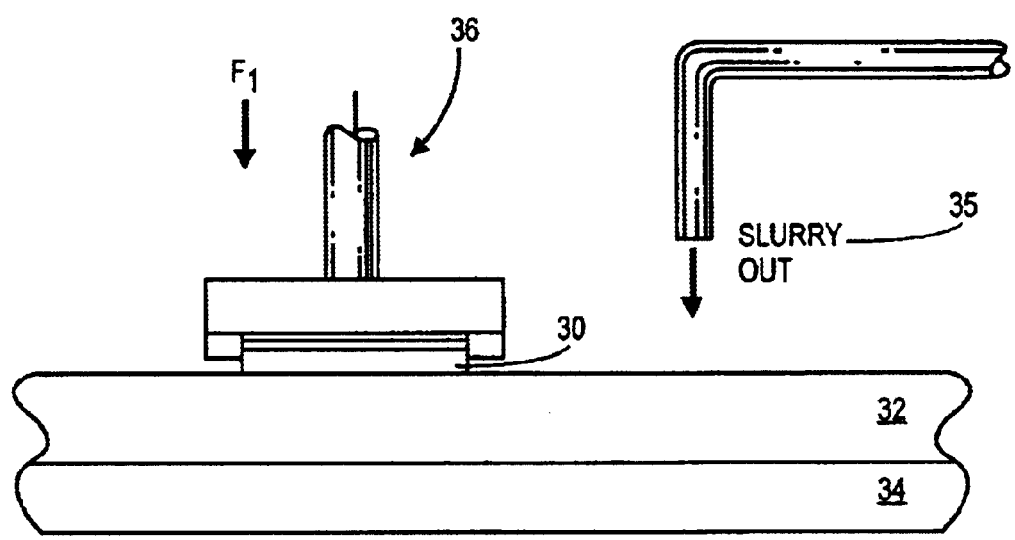
FIG. 2c is a cross-sectional illustration of a chemical mechanical polishing apparatus used to polish the films formed on the substrate of FIG. 2b.
Figure 3:
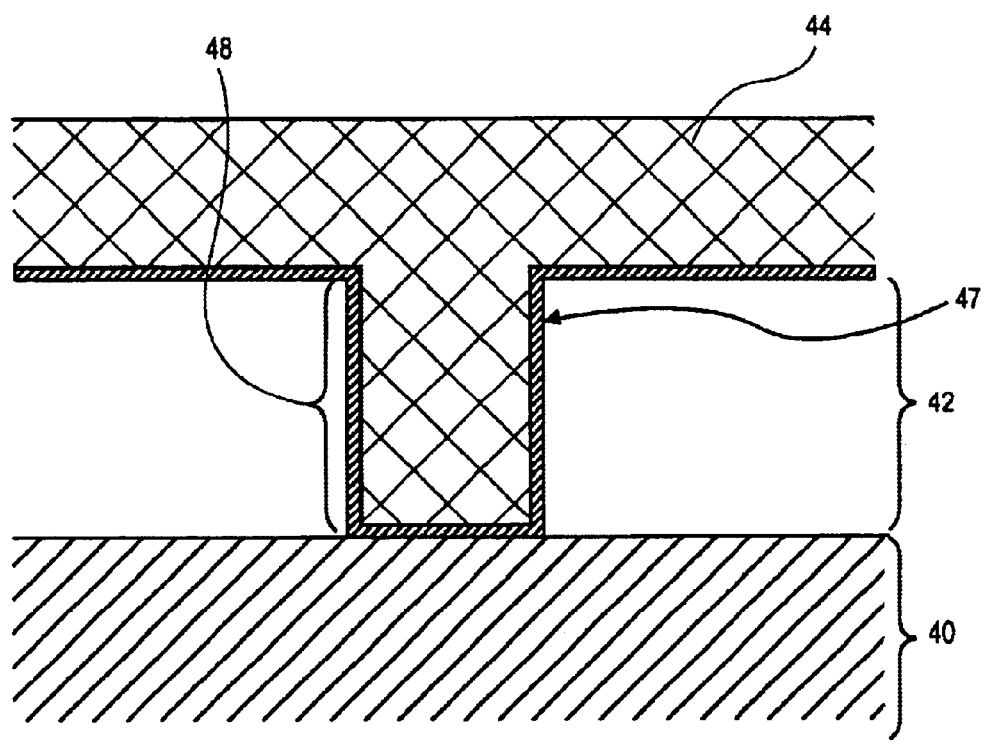
FIG. 3 is a cross-sectional view of a substrate in which a metal layer is deposited thereon filling an opening or via with a metal in accordance with an embodiment of the invention.

FIGS. 3–7 show one embodiment of the invention in which a particle that is trapped in a recessed region in metal layer is removed using a solution comprising hydrogen peroxide. In FIG. 3, substrate 40 has an interlayer dielectric ("ILD") 42 deposited thereon. Via hole 48 is formed in ILD 42 using conventional techniques such as photolithographic techniques. Substrate 40 is used in fabricating semiconductor devices or to make contact with other metal layers. A layer of adhesion material 47 such as titanium (Ti) or titanium nitride (TiN) is formed on ILD 42 to improve the adhesion between ILD 42 and metal layer 44. Metal layer 44 comprises, for example, tungsten or other suitable metal (e.g. copper, aluminum, etc.) deposited over adhesion material layer 47 in via hole 48.

Figure 4:
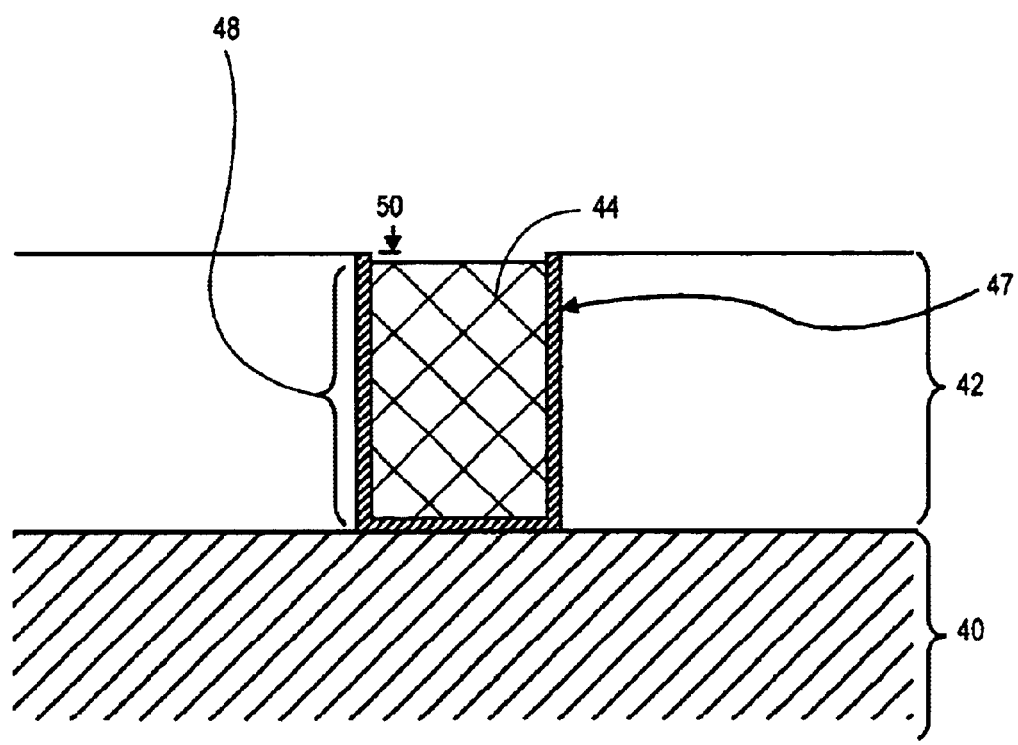
FIG. 4 is a cross-sectional view of the device in FIG. 3 after the device has undergone polishing in accordance with an embodiment of the invention.

FIG. 4 shows the structure of FIG. 3 after the surface of the structure has undergone a CMP operation and a portion of metal layer 44 has been removed outside of via hole 48. Due to the polishing operation, recess 50 is generally formed in the via. The slurry (also referred to herein as a first agent) comprises an abrasive material such as alumina, silica, ceria, zirconia or other suitable material. The abrasive material comprises approximately in the range of 2 to 5% by weight of the slurry. The slurry may also contain a chemical reagent such as hydrogen peroxide and nitric acid.

Figure 5:
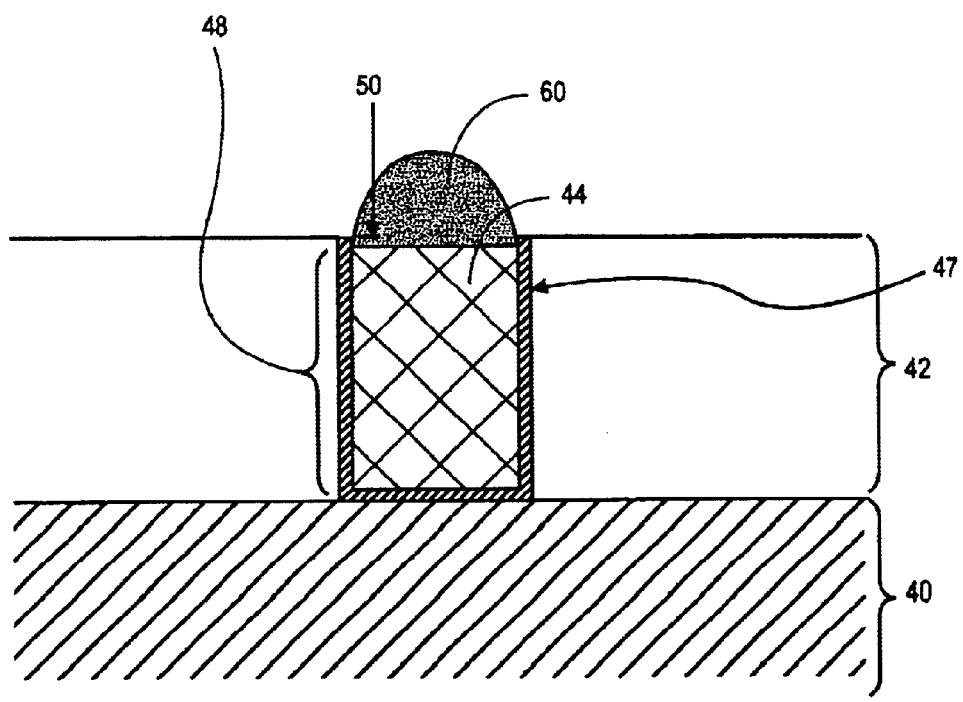
FIG. 5 shows a particle that is located in a recessed region of a metal layer.

FIG. 5 shows particle 60 trapped in recess 50 of substrate 10. Particles such as particle 60 occur from a variety of sources. For example, in a polishing process, a slurry comprising an abrasive material is used. The abrasive material may remain on the metal layer after the polishing operation has been completed. Particles may also be present due to debris generated during the polishing operation.

Figure 6:
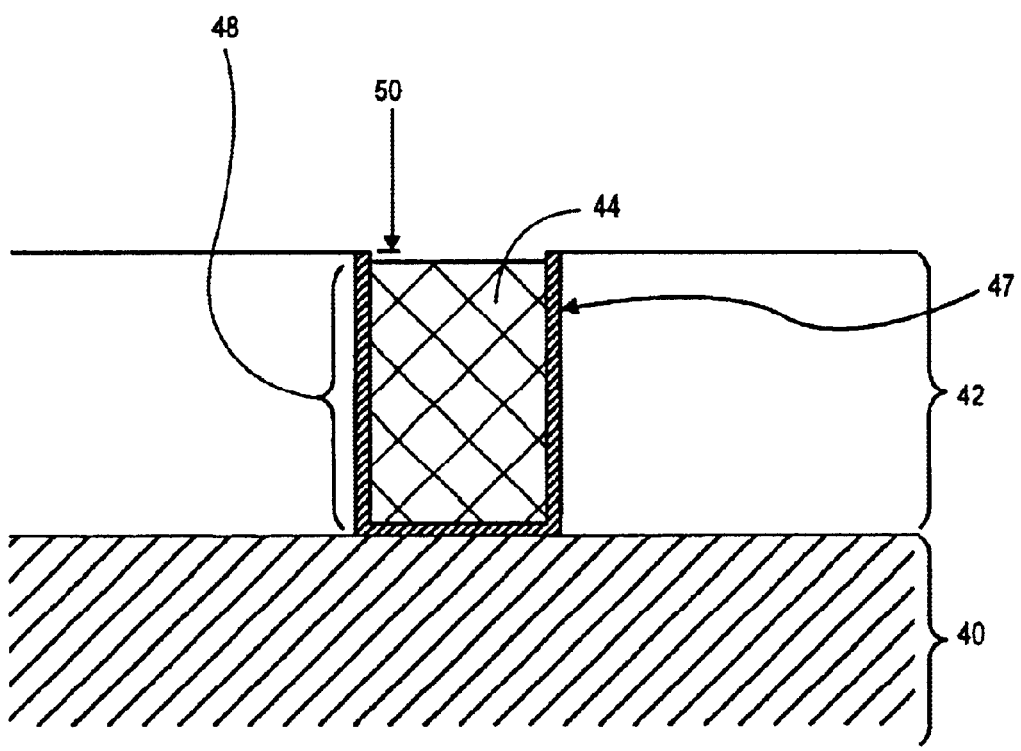
FIG. 6 shows that the particle has been removed by using a solution comprising hydrogen peroxide.

FIG. 6 shows the structure of FIG. 5 after the surface of adhesion material layer 47 and metal layer 44 has been rinsed with a solution (also referred to herein as a second agent) and particle 60 has been driven into the solution and removed from recessed region 50.

The substrate may be rinsed by spraying the substrate. An alternative embodiment to spraying the solution includes using a bath in which the substrate is submerged into a bath containing the rinsing solution. Additionally, the rinsing solution may be introduced through the polisher.

In one embodiment, the rinsing solution comprises approximately 4% by volume of hydrogen peroxide, and generally comprises hydrogen peroxide in the approximate range of 2% to 4.5%. The upper limit of hydrogen peroxide concentration is that amount that removes too much of metal layer 44 such that the reliability of the wafer is affected. The remainder of the rinse contains deionized water. In the operation, if a 4% by volume hydrogen peroxide solution is introduced onto a tungsten material, a removal rate of approximately 60 Å/minute is achieved. The removal rate generally ranges from approximately 20 to 80 Å/minute.

The rinsing solution comprises deionized water and the hydrogen peroxide that is introduced onto the polishing pad occurs at a pressure of approximately 0.5 to 2 psi and flow rate of 50 to 300 cc/minute. For example, the flow rate of the solution is approximately 200 cc/minute for approximately 30 seconds. Preferably, the solution containing hydrogen peroxide and deionized water may be mixed or combined in a container as a separate operation. The solution that has the desired ratio of hydrogen peroxide to deionized water is placed into a container (not shown) that is attached to the polisher. This allows the solution to be fed into the polisher. Alternatively, the hydrogen peroxide and the deionized water may be separately introduced into the polisher at such a volumetric rate that the correct ratio of hydrogen peroxide to deionized water is met prior to the solution contacting the substrate.

In one aspect, the duration of the polishing in the rinse operation is directly proportional to the amount of particles that are to be removed. For example, if the metal layer is believed to be heavily contaminated with particles, polishing may take up to 60 seconds. However, if few particles are on the substrate, polishing may take less than 10 seconds. During the polishing operation in the rinse operation, the rate at which metal layer is removed is approximately 60 Å/minute.

The polishing pressure in the rinse operation with which carrier 140 presses polishing pad 120 onto interconnection layer 70 is generally in the range of approximately 0.5 to 2 psi and is preferably maintained at about 1.0 psi. It is desirable to use a lower polish rate (e.g., less than 60 Å/minute) in order to avoid creating a large recessed region that may cause the integrated circuit to fail.

Figure 7:
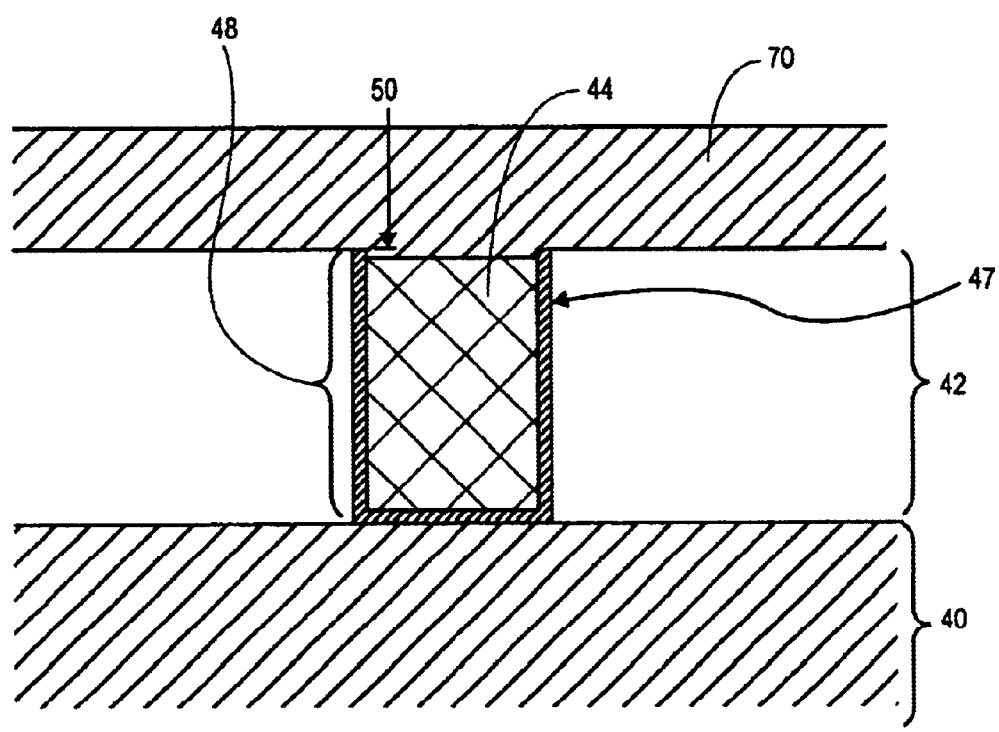
FIG. 7 shows the device as in FIG. 6 in which a metal has been deposited thereon.

FIG. 7 shows interconnection layer 70 which is a metal material selected from the group comprising of aluminum, copper, tungsten, and the like, is deposited over adhesion material layer 47 and metal layer 44. Interconnection layer 70 is patterned into lines using photoresistant etching such as photolithography and etching. Since particles such as particle 60 were removed from the substrate before another layer of metal was deposited over adhesion material layer 47, the electrical conduction is not blocked by foreign particles. Accordingly, the device fabricated by the process described herein reduces the amount of possible failures that may occur with integrated circuits.

Figure 8:
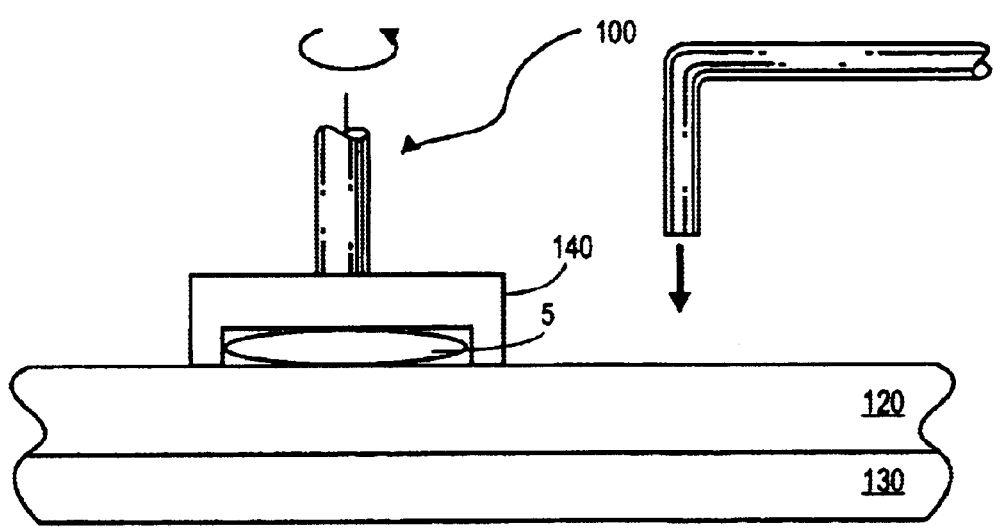
FIG. 8 shows a polisher that may be used in accordance with an embodiment of the invention.

FIG. 8 shows a polisher that may be used in the polishing process. Polishing involves at least one polisher 100 comprising a carrier 140, a polishing pad 120, and a platen 130. Carrier 140 holds substrate 5. Platen 130 holds polishing pad 120 in place.

Polishing pad 120 may use a dual layer polishing pad wherein the top pad of the polishing pad may comprise polyurethane and the bottom pad may comprise a hard material, for example, polyester fiber. Polishing pad 120 is generally conditioned with a conditioner brush prior to the polishing operation.

The polishing operation is accomplished by bringing the substrate placed in a solid retaining ring (not shown) into contact with the polishing pad 120. Carrier 140 presses substrate 5 onto polishing pad 120. Carrier 140 and polishing pad 120 are then rotated. It will be appreciated that because carrier 140 is holding substrate 5 by using a slotted retaining ring (not shown), substrate 5 is rotated against the polishing pad 120 to polish the surface of the metal layer on substrate 5. Polishing pad 120 contacts the metal layer and removes the portion of the metal layer not extending into the via. Polishing pressures for this process are generally in the range of approximately 3 to 6 psi.

A temperature of around 20° C. to 25° C. of the platen/polishing pad may be used during the polishing process. It will be appreciated, however, that the invention can be practiced at a variety of temperatures depending upon the composition of the metal layer and the substrate. The temperatures of the process may be controlled by refrigerating the slurry and polishing pad.

The rotation of polishing pad 120 (polishing pad rotation) and the rotation of carrier 140 (carrier rotation) are also controlled. Polishing pad 120 is rotated at approximately 50 to 500 rpm and carrier 140 is rotated at approximately 10 to 100 rpm. Preferably, the carrier rotation is maintained at approximately 50 rpm and the polishing pad rotation is maintained at approximately 250 rpm.

Figure 9:
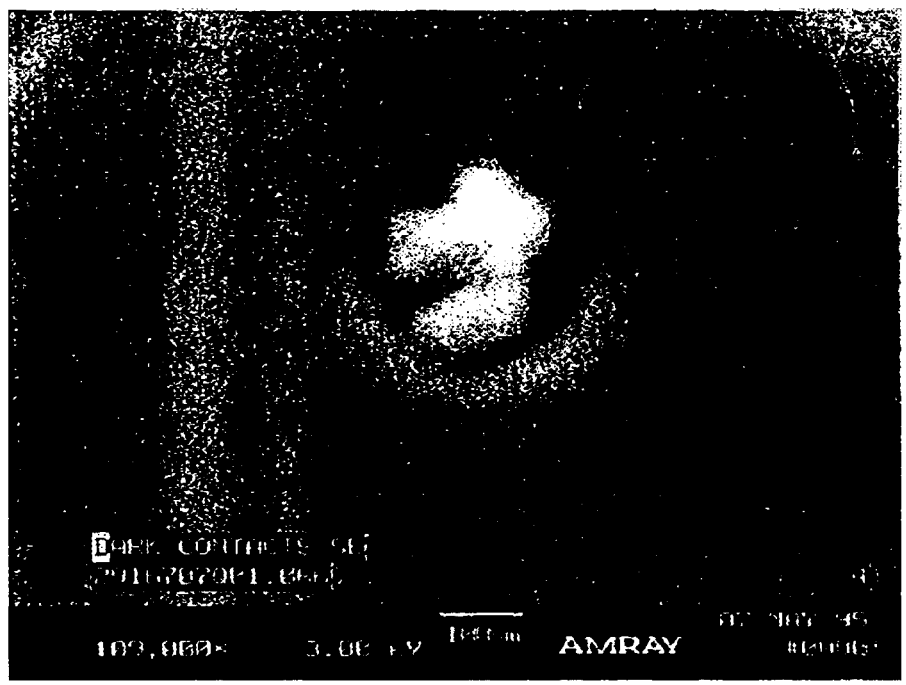
FIG. 9 shows a picture of a particle located within a recessed region of a metal layer.
Figure 10:
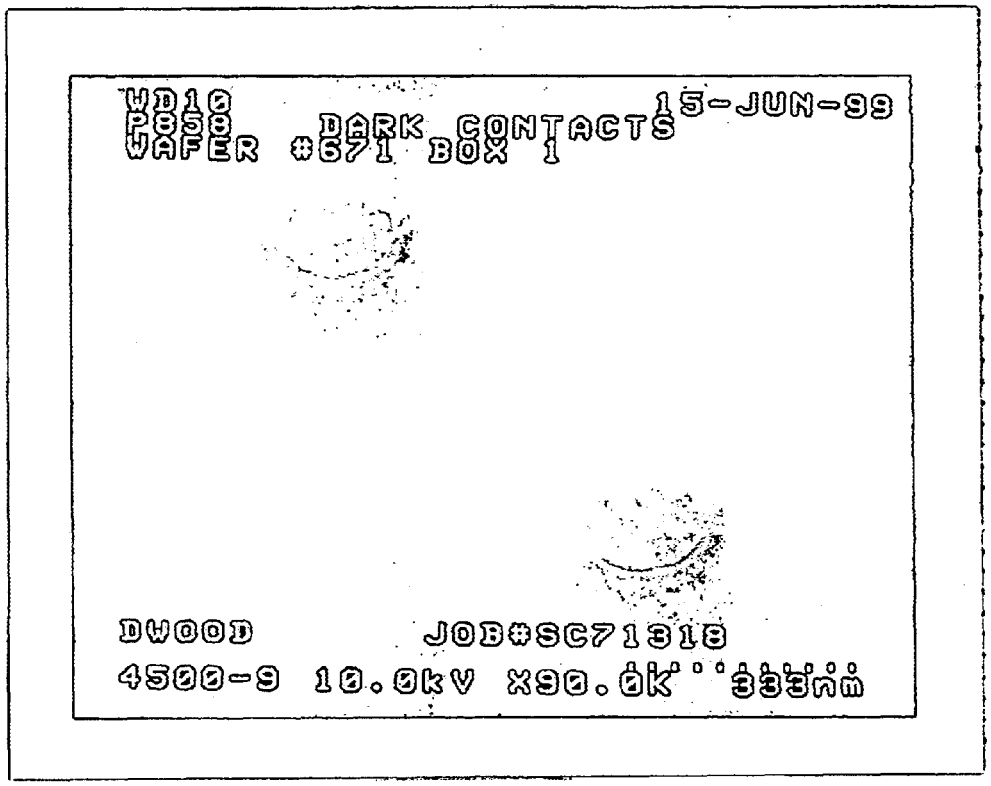
FIG. 10 shows that the particle has been removed after the wafer has been rinsed with a solution containing hydrogen peroxide.

FIGS. 9 and 10 show particles on the substrate and substrate after the particles have been removed. FIG. 9 shows a picture of a substrate having a metal layer wherein particles are located thereon after a conventional high-speed rinse post-polish was used. FIG. 10 shows that no particles remain on the metal layer after the process described herein has been used.

Figure 11:
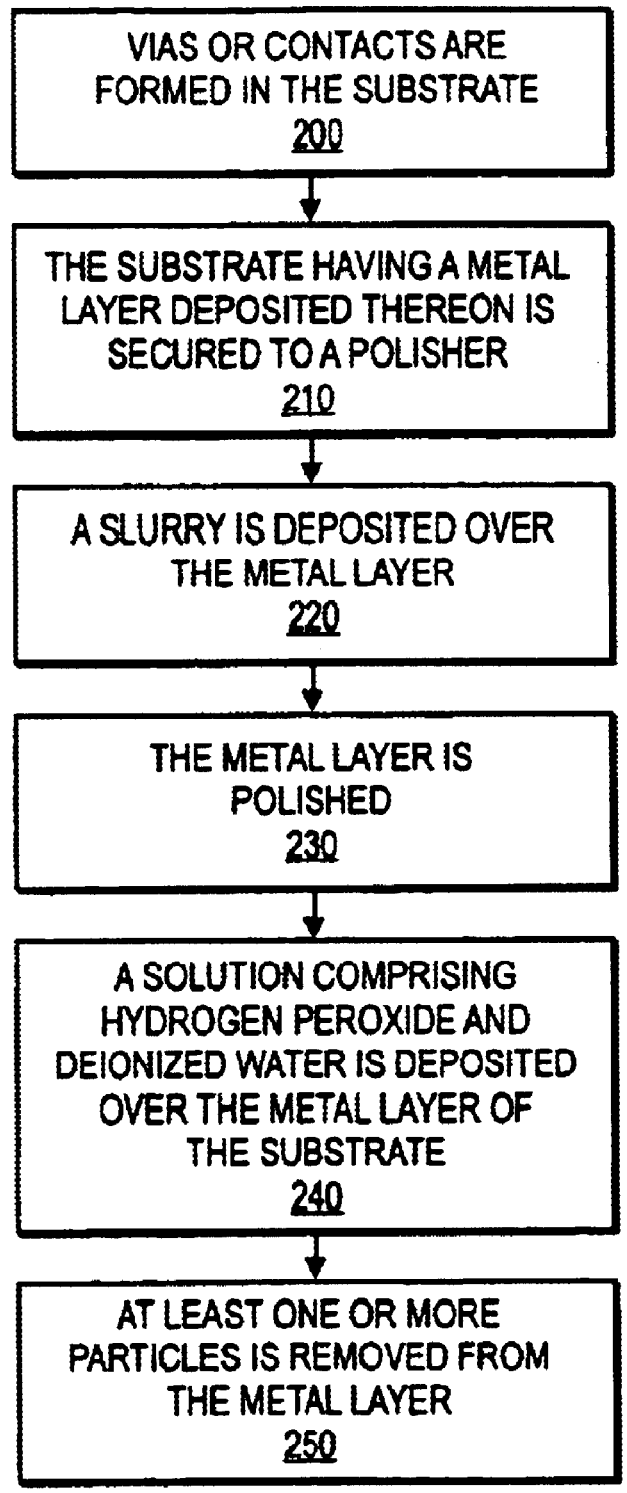
FIG. 11 is a flow chart of one embodiment of the invention.

FIG. 11 shows the operations used to perform one embodiment of the invention. At operation 200, vias or contacts are formed in the substrate and an adhesion layer that serves as a barrier layer is deposited thereon. At operation 210, the substrate having a metal layer deposited thereon is placed in a slotted ring (not shown) of a polisher. At operation 220, a slurry is placed onto the polishing pad and the polishing pad contacts the metal layer coupled to the substrate. At operation 230, the metal layer is polished using polishing means such as described above. At operation 240, a solution comprising hydrogen peroxide is deposited onto the polishing pad. The polishing pad then contacts a metal layer on the substrate. At operation 250, at least one or more particles is removed from the metal layer on the substrate.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method of removing a particle from a surface of a metal plug formed in a via comprising:
    introducing a first agent to a metal layer over the metal plug;
    polishing the metal layer with the first agent; and
    while polishing the metal layer with the first agent, introducing a second agent comprising hydrogen peroxide onto a surface of the metal plug through a polisher;
    polishing the surface of the metal plug with the second agents, wherein polishing includes driving at least one particle off the surface of the metal plug.

2. The method of claim 1, wherein polishing the metal layer comprises polishing a metal material selected from the group consisting of tungsten, aluminum and copper.

3. The method of claim 1, wherein polishing the metal layer comprises polishing with the first agent having an abrasive material selected from the group consisting of silica, alumina, zirconia, and ceria.

4. The method of claim 1, wherein polishing the metal layer comprises chemical mechanical polishing.

5. The method of claim 1, wherein introducing the second agent comprises introducing a second agent of approximately 4% by volume of hydrogen peroxide.

6. The method of claim 1, wherein polishing the metal layer with the second agent includes polishing with a polisher operating at a polishing pressure approximately in the range of 0.5 to 2.0 psi.

7. A method of removing at least one particle from a surface of a metal plug disposed over a substrate comprising:
    depositing a slurry onto a metal layer over the metal plug;
    polishing the metal layer; and
    after polishing the metal layer, spraying a solution comprising hydrogen peroxide onto the surface of the metal plug;
    wherein spraying includes driving at least one particle off the surface of the metal plug with the solution.

8. The method of claim 7, wherein polishing the metal layer comprises polishing a metal material selected from the group consisting of tungsten, copper, and aluminum.

9. The method of claim 7, wherein depositing the slurry further comprises depositing a slurry having an abrasive material selected from the group consisting of silica, alumina, zirconia, and ceria.

10. The method of claim 7, wherein the solution comprises approximately 4% by volume of hydrogen peroxide.

11. The method of claim 7, wherein polishing the metal layer includes removing the metal layer at a rate of approximately in the range of 40 Å/minute to 80 Å/minute.

12. The method of claim 7, wherein polishing the metal layer comprises chemical mechanical polishing.

13. The method of claim 7, wherein polishing the metal layer comprises polishing with a polisher at a polishing pressure approximately in the range of 0.5 to 2.0 psi.

14. The method of claim 13, wherein the metal layer is removed at a rate of 60 Å/minute.

15. A method comprising:
    polishing a metal layer over a conductive plug with a slurry;
    while polishing the metal layer, spraying a rinsing solution comprising hydrogen peroxide onto the conductive plug;
    wherein spraying includes driving at least one particle off a surface of the conductive plug with the rinsing solution.

16. The method of claim 15, further including polishing the metal layer with an abrasive material.

17. The method of claim 15, wherein spraying a rinsing solution comprises spraying a rinsing solution of approximately 4% by volume of hydrogen peroxide.

18. The method of claim 15, wherein a polishing pressure in the range of approximately 0.5 to approximately 2.0 psi is applied.

19. The method of claim 15, wherein a metal layer is removed at a rate of 60 Å/minute.

20. A method of removing a particle from a surface of a metal plug formed in a via comprising:
- introducing a first agent to a metal layer over the metal plug;
- polishing the metal layer with the first agent; and
- while polishing the metal layer, spraying a second agent comprising hydrogen peroxide onto the surface of the metal plug,
  - wherein spraying includes driving at least one particle off the surface of the metal plug with the second agent.

21. A method of removing at least one particle from a surface of a metal plug disposed over a substrate comprising:
- depositing a slurry onto a metal layer over the metal plug;
- polishing the metal layer; and
- after polishing the metal layer, introducing a solution comprising hydrogen peroxide over the surface of the metal plug through a polisher;
- rinsing the surface of the metal plug with the solution, wherein rinsing includes driving at least one particle off the surface of the metal plug with the solution and the polisher.

22. A method comprising:
- polishing a metal layer over a conductive plug with a slurry; and
- while polishing the metal layer, introducing a rinsing solution comprising hydrogen peroxide onto the conductive plug through a polisher,
  - wherein introducing includes driving at least one particle off a surface of the conductive plug using the rinsing solution.

23. A method of removing a particle from a surface of a metal plug formed in a via comprising:
- introducing a first agent to a metal layer over the metal plug;
- polishing the metal layer with the first agent; and
- while polishing the metal layer, introducing a second agent consisting of hydrogen peroxide and water onto the surface of the metal plug,
  - wherein introducing includes one of spraying the second agent onto the surface and introducing the second agent onto the surface through a polisher; and
  - wherein introducing includes driving at least one particle off the surface of the metal plug with the second agent.

24. A method of removing at least one particle from a surface of a metal plug disposed over a substrate comprising:
- depositing a slurry onto a metal layer over the metal plug;
- polishing the metal layer; and
- after polishing the metal layer, introducing a solution consisting of hydrogen peroxide and water onto the surface of the metal plug,
  - wherein introducing includes one of spraying the solution onto the surface and introducing the solution onto the surface through a polisher, and
  - wherein introducing includes driving at least one particle off the surface with the solution.

25. A method comprising:
- polishing a metal layer over a conductive plug with a slurry; and
- while polishing the metal layer, introducing a rinsing solution onto the conductive plug, the rinsing solution consisting of hydrogen peroxide and water,
  - wherein introducing includes one of spraying the solution onto the conductive plug and introducing the solution onto the conductive plug through a polisher;
  - wherein introducing includes driving at least one particle off a surface of the conductive plug with the solution.

* * * * *

UNITED STATES PATENT AND TRADEMARK OFFICE
CERTIFICATE OF CORRECTION

PATENT NO. : 6,841,470 B2
DATED : January 11, 2005
INVENTOR(S) : Wang et al.

It is certified that error appears in the above-identified patent and that said Letters Patent is hereby corrected as shown below:

Column 6,
Line 2, delete "agents" and insert -- agent --.

Signed and Sealed this

Tenth Day of May, 2005

JON W. DUDAS
*Director of the United States Patent and Trademark Office*